(12) United States Patent
Jouppi

(10) Patent No.: US 8,105,882 B2
(45) Date of Patent: Jan. 31, 2012

(54) PROCESSING A MEMORY REQUEST IN A CHIP MULTIPROCESSOR HAVING A STACKED ARRANGEMENT

(75) Inventor: Norman Paul Jouppi, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/878,215

(22) Filed: Sep. 9, 2010

(65) Prior Publication Data

US 2010/0332764 A1 Dec. 30, 2010

Related U.S. Application Data

(62) Division of application No. 12/575,070, filed on Oct. 7, 2009, now Pat. No. 7,811,865, which is a division of application No. 11/706,742, filed on Feb. 14, 2007, now Pat. No. 7,615,857.

(51) Int. Cl.
*H01L 21/44* (2006.01)
*H01L 21/48* (2006.01)
*H01L 21/50* (2006.01)

(52) U.S. Cl. .................... 438/123; 438/110; 257/678

(58) Field of Classification Search ............... 438/110, 438/119, 123; 257/679, 686, 693; 711/118, 711/132

See application file for complete search history.

(56) References Cited

U.S. PATENT DOCUMENTS

| 5,649,144 | A | 7/1997 | Gostin et al. | |
|---|---|---|---|---|
| 5,828,578 | A | 10/1998 | Blomgren | |
| 6,247,094 | B1 | 6/2001 | Kumar et al. | |
| 6,349,360 | B1 | 2/2002 | Arimilli et al. | |
| 6,647,463 | B2 | 11/2003 | Yamashiroya | |
| 6,725,334 | B2 | 4/2004 | Barroso et al. | |
| 6,848,071 | B2 | 1/2005 | Chaudhry et al. | |
| 6,972,494 | B1 | 12/2005 | Addinall et al. | |
| 6,976,131 | B2 | 12/2005 | Pentkovski et al. | |
| 7,296,259 | B2 * | 11/2007 | Betker et al. | .................. 717/129 |
| 7,305,522 | B2 | 12/2007 | Clark et al. | |
| 7,615,857 | B1 | 11/2009 | Jouppi | |
| 7,811,865 | B2 | 10/2010 | Jouppi | |
| 2003/0005230 | A1 * | 1/2003 | Solomon et al. | ............. 711/128 |

OTHER PUBLICATIONS

Bryan Black, et al., "3D Processing Technology and its Impact on iA32 Microprocessors", 2004, 3 sheets, Proceedings of the International Conference of Computer Design (ICCD).
Feihu Li, et al., "Design and Management of 3D Chip Multiprocessors Using Network-in-Memory", 2006, 12 sheets, Proceedings of the 33rd International Symposium on Computer Architecture (ISCS).
Taeho Kgil, et al., "PicoServer: Using 3D Stacking Technology to Enable a Compact Energy Efficient Chip Multiprocessor", 2006, pp. 117-128, Proceedings of Architectural Support for Operating Systems and Programming Languages (ASPLOS).

* cited by examiner

*Primary Examiner* — Phuc Dang

(57) ABSTRACT

A chip multiprocessor die supports optional stacking of additional dies. The chip multiprocessor includes a plurality of processor cores, a memory controller, and stacked cache interface circuitry. The stacked cache interface circuitry is configured to attempt to retrieve data from a stacked cache die if the stacked cache die is present but not if the stacked cache die is absent. In one implementation, the chip multiprocessor die includes a first set of connection pads for electrically connecting to a die package and a second set of connection pads for communicatively connecting to the stacked cache die if the stacked cache die is present. Other embodiments, aspects and features are also disclosed.

6 Claims, 6 Drawing Sheets

PROCESSING A MEMORY REQUEST IN A CHIP MULTIPROCESSOR HAVING A STACKED ARRANGEMENT

CROSS-REFERENCE TO RELATED APPLICATION

This is a divisional of U.S. Ser. No. 12/575,070, entitled "Modular Three-Dimensional Chip Multiprocessor," filed Oct. 7, 2009, U.S. Pat. No. 7,811,865, which is a divisional of U.S. Ser. No. 11/706,742, entitled "Modular Three-Dimensional Chip Multiprocessor," filed Feb. 14, 2007, U.S. Pat. No. 7,615,857. Both applications are hereby incorporated by reference.

BACKGROUND

1. Technical Field

The present application relates generally to processors and memory for computer systems.

2. Description of The Background Art

Conventional two-dimensional (2-D) microprocessors, including conventional chip multiprocessors, are formed on a single silicon die. In order to increase performance of these microprocessors, further components, such as more processor cores, caches and memory controllers, are generally being integrated into the single silicon die.

Recently, however, technologies for stacking of silicon die have been developed. In order to apply the stacking technologies to chip multiprocessors, various proposals have been made. Each of these proposals provide an architecture or design for implementing the chip multiprocessor on a stack of silicon dies. For example, one set of proposals splits each core of the chip multiprocessor between multiple stacked die.

Applicants have observed that each of the proposals for applying stacking to chip multiprocessors makes the natural assumption that stacking will be required. In other words, the designs are optimized assuming stacking of silicon dies.

SUMMARY

One embodiment relates to a chip multiprocessor die supporting optional stacking of additional dies. The chip multiprocessor includes a plurality of processor cores, a memory controller, and stacked cache interface circuitry. The stacked cache interface circuitry is configured to attempt to retrieve data from a stacked cache die if the stacked cache die is present but not if the stacked cache die is absent. In one implementation, the chip multiprocessor die includes a first set of connection pads for electrically connecting to a die package and a second set of connection pads which can be configured for communicatively connecting to the stacked cache die if the stacked cache die is present.

Other embodiments, aspects, and features are also disclosed.

DETAILED DESCRIPTION

The present application discloses an architectural design for a chip multiprocessor die in embodiments of the present invention, where the chip microprocessor die is configured to be modular in that the 3-D stacking of additional levels of cache memory is optional, i.e. possible but not required. In this architecture, all the cores are contained on a single processor die. Additional cache levels may be optionally stacked using additional die.

Figure 1A:
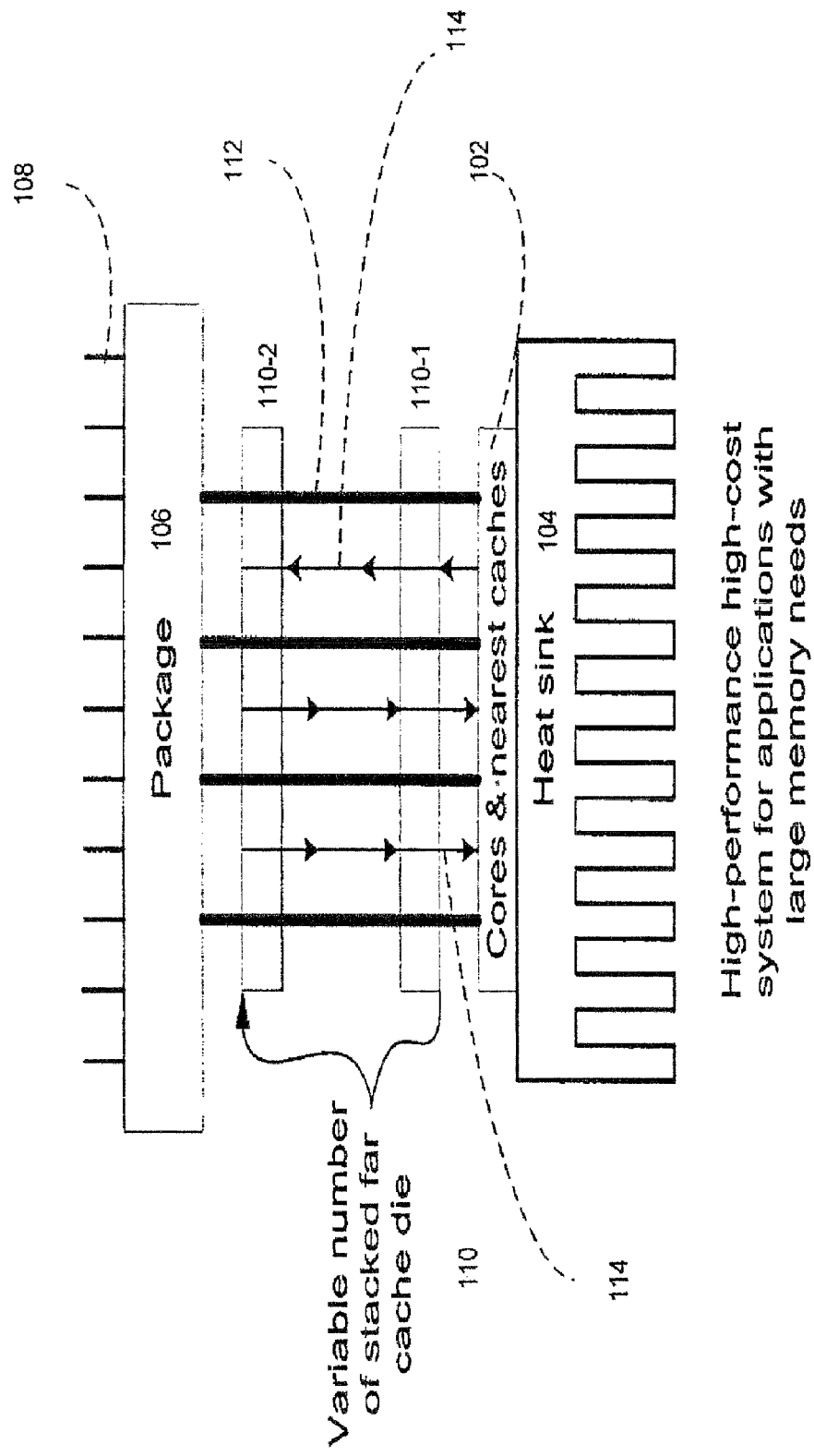
FIG. 1A is a schematic cross-sectional diagram depicting a modular (stackable) chip multiprocessor with a variable number of stacked die for high-performance system applications in accordance with an embodiment of the invention.

FIG. 1A is a schematic cross-sectional diagram depicting a modular (stackable) chip multiprocessor with a variable number of stacked die for high-performance system applications in accordance with an embodiment of the invention. In this embodiment, the chip multiprocessor (CMP) die 102 includes the multiple processor cores and one or more of near cache levels.

The heat sink 104 may be advantageously attached to the chip multiprocessor die 102, and the package 106 (including connectors 108 for power and input/output) is preferably attached to at least one stacked cache die (for example, the topmost stacked die 110-2 in the illustrated example), if any. Of course, while the CMP 102, stacked cache die 110, and package 106 are shown spaced apart in FIG. 1 for purposes of depicting the stacking order, an actual implementation would not typically have the spacing between the components. Instead the stacked cache die 110 would be stacked directly on top of the CMP 102, and package 106 would be configured on top of the stacked cache die 110.

Figure 1B:
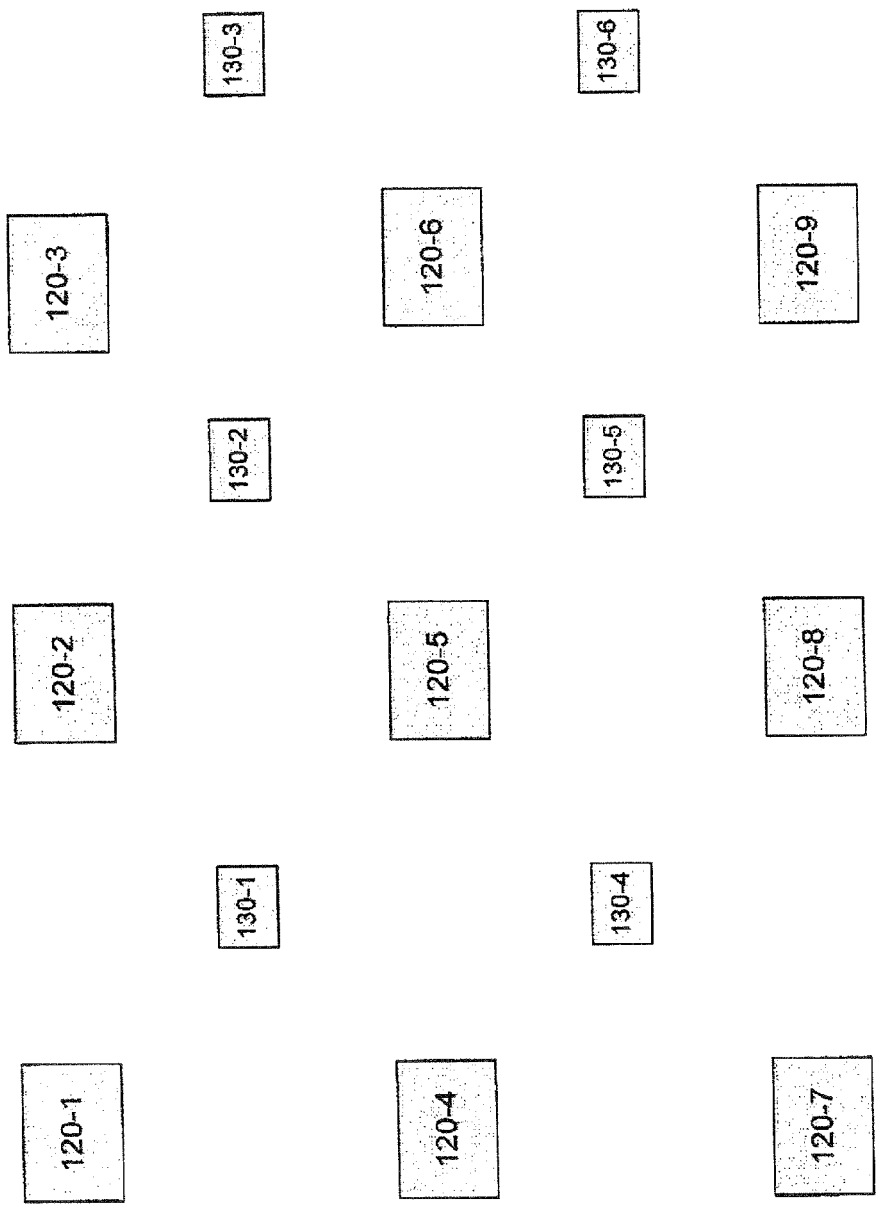
FIG. 1B is a schematic planar-view diagram depicting two sets of contact pads for a modular chip multiprocessor having at least one stacked die in accordance with an embodiment of the invention.

FIG. 1B is a schematic planar-view diagram depicting two sets of contact pads for a modular chip multiprocessor having at least one stacked die in accordance with an embodiment of the invention. Note that the particular arrangement, shape and scaling of the contact pads shown in FIG. 1B are arbitrary for purposes of explanation.

As shown in FIG. 1B, the contact layer of the base die 102 for the chip multiprocessor is preferably configured to have two sets of connection pads. A first set of pads 120 preferably includes pads with larger surface areas and may either be connected directly to a package 106 or routed through one or more stacked die 110 to a package 106. The interconnections from this first set of connection pads are shown by the thicker lines 112 in FIG. 1A. A second set of pads 130 preferably include pads having smaller surface areas and would preferably only be used for communicating with stacked die 110 if they were present in the system. The interconnections for these connection pads are shown by the thinner lines 114 in FIG. 1A.

Figure 2A:
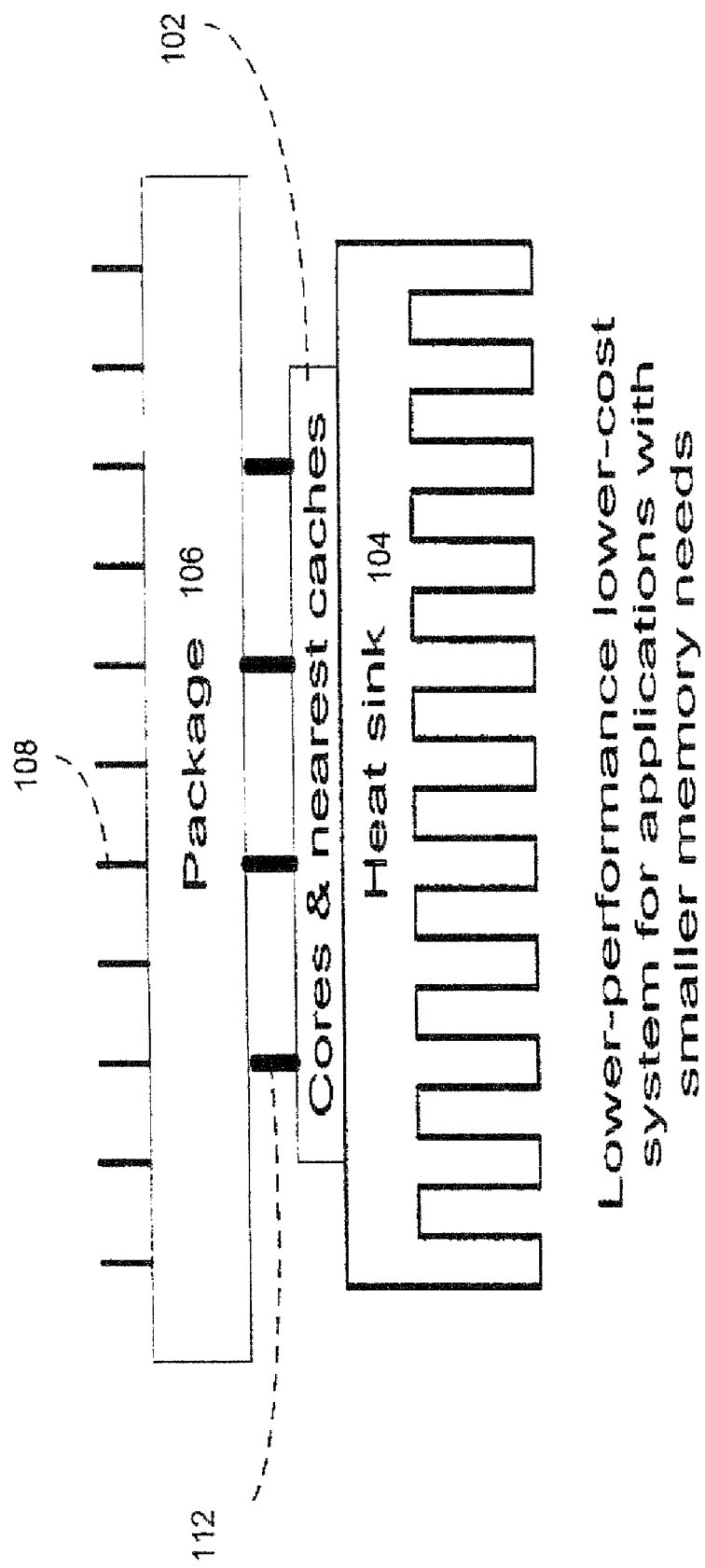
FIG. 2A is a schematic cross-sectional diagram depicting a modular chip multiprocessor without any stacked die for low-cost system applications in accordance with an embodiment of the invention.

FIG. 2A is a schematic cross-sectional diagram depicting a modular chip multiprocessor without any stacked die for low-cost system applications in accordance with an embodiment of the invention. In this embodiment, the base die of the chip multiprocessor 102 is present, but the stacked cache die 110 are absent. As such, the thicker interconnections 112 to the package 106 are used, but there are no thinner connections 114 to the absent stacked cache die 110.

Figure 2B:
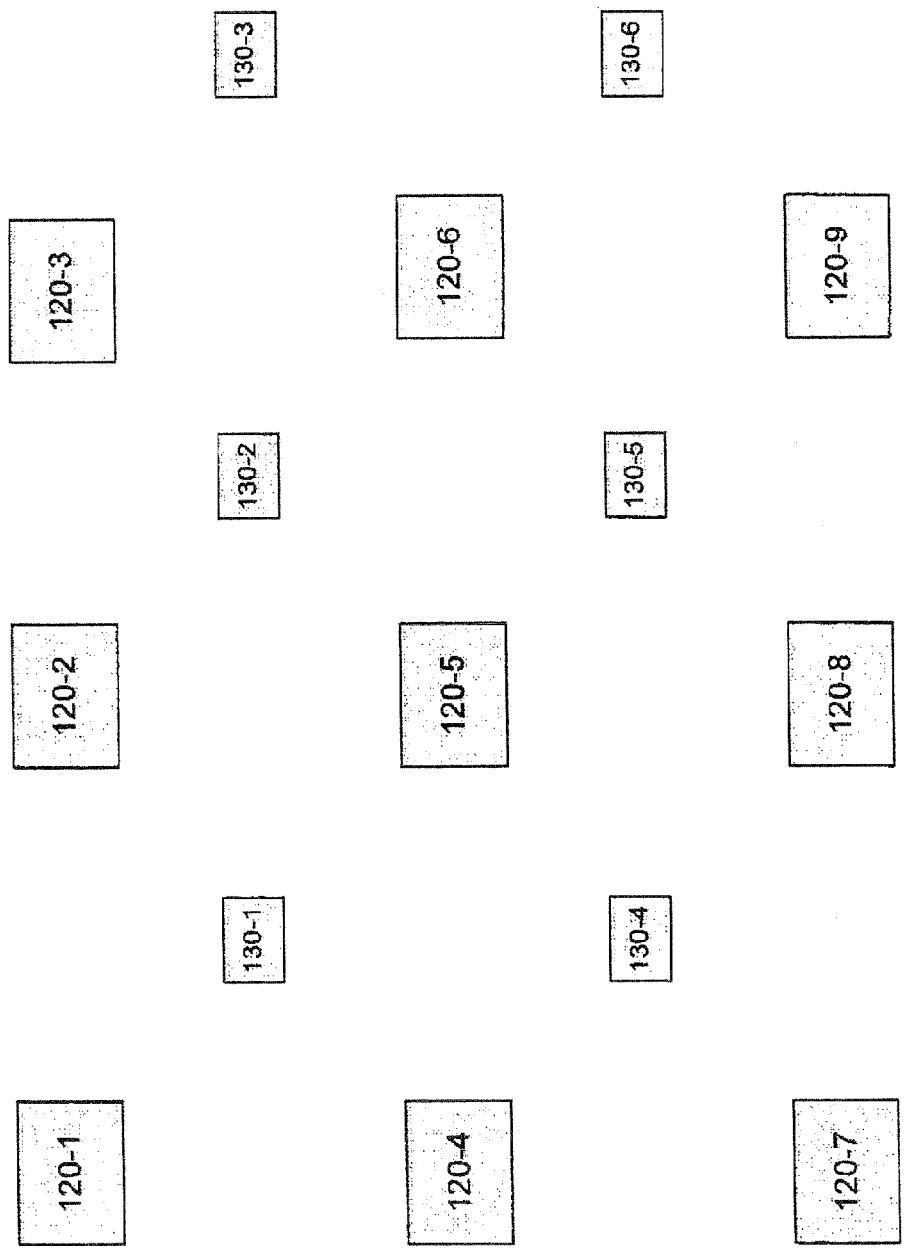
FIG. 2B is a schematic planar-view diagram depicting two sets of contact pads for a modular chip multiprocessor having no stacked die in accordance with an embodiment of the invention.

FIG. 2B is a schematic planar-view diagram depicting two sets of contact pads for a modular chip multiprocessor having no stacked die in accordance with an embodiment of the invention. Note again that the particular arrangement and scaling of the contact pads shown in FIG. 2B are arbitrary for purposes of explanation.

As shown in FIG. 2B, the contact layer of the base die for the chip multiprocessor 102 is again configured to have two sets of connection pads. The first set of pads 120 preferably includes pads with larger surface areas and may be connected directly to a package 106. The interconnections from this first set of connection pads are shown by the thicker lines 112 in FIG. 2A. The second set of pads 130 preferably include pads having smaller surface areas and would preferably only be used for communicating with stacked die 110 if they were present in the system. In this case, however, there are no (optional) stacked die 110 present. Hence, the second set of pads 130 remain unconnected and un-used.

Advantageously, using this architectural design, the number of stacked cache die 110 is variable. In the particular implementation shown in FIG. 1A, two stacked cache die 110-1 and 110-2 are shown. This implementation may correspond to a high-performance high-cost multiprocessor system for applications with large memory needs. On the other hand, in the particular implementation shown in FIG. 2A, no stacked cache die 110 are shown. This implementation may correspond to a lower-performance lower-cost multiprocessor system for applications with smaller memory needs.

Furthermore, this architectural design advantageously positions the cores, which typically dissipate the vast majority of power and hence generate the most heat, nearest to the heat sink 104 and the optional stacked cache die, which typically generate much less heat, further from the heat sink 104.

Figure 3:
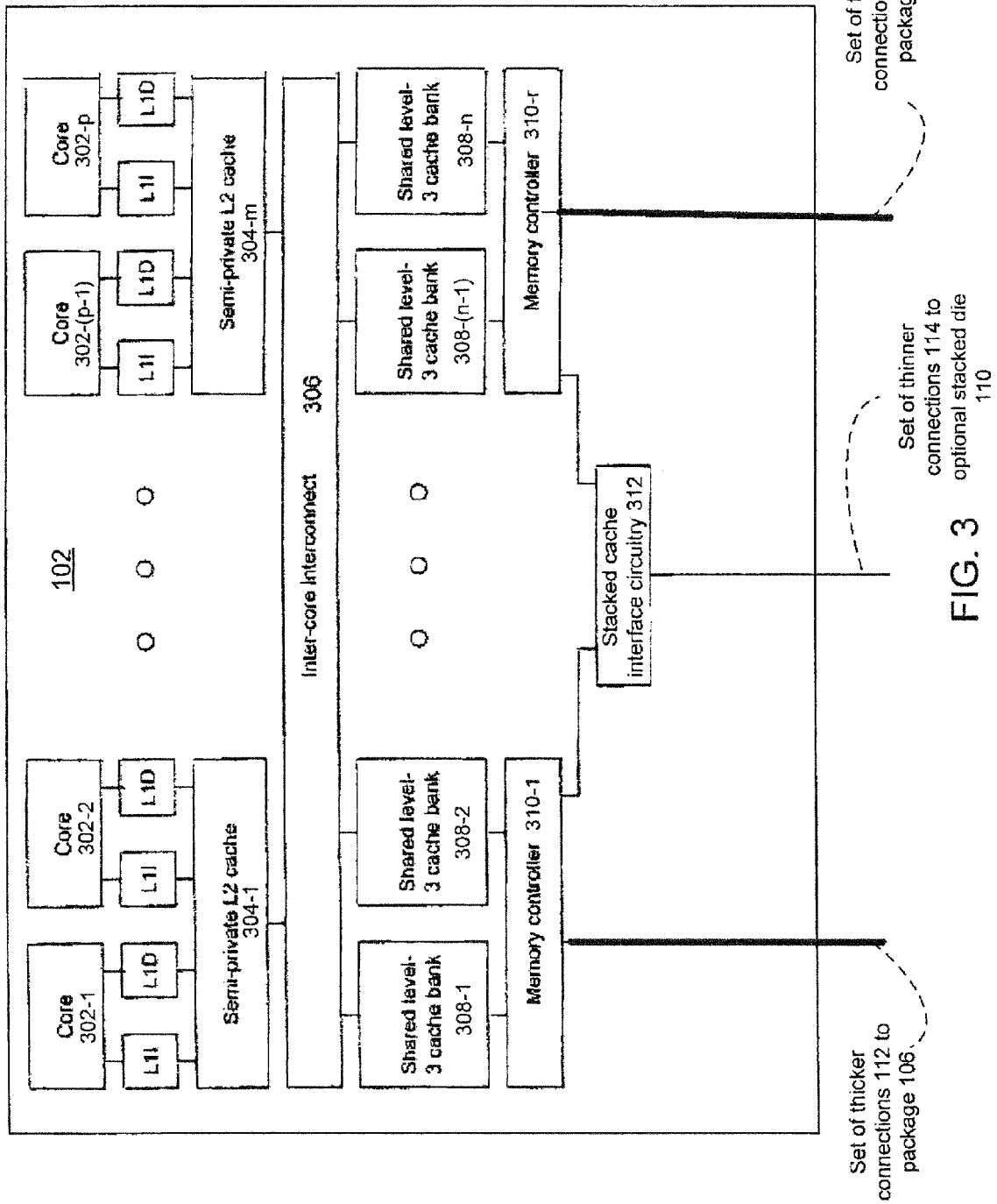
FIG. 3 is a schematic diagram showing an example logic design for a modular 3-D chip multiprocessor in accordance with an embodiment of the invention.

An example logical design for a chip multiprocessor 102 in accordance with an embodiment of the present invention is illustrated in FIG. 3. While a particular CMP design (i.e. one with private L1 caches, semi-private L2 caches, and a shared L3 cache) is shown in FIG. 3, other specific CMP designs may be utilized in accordance with other embodiments of the invention.

As shown in FIG. 3, the chip multiprocessor 102 includes multiple processor cores 302. Level one instruction (L1I) and level one data (L1D) caches may be provided for each core 302. In this particular implementation, semi-private level two (L2) caches 304 are each shared by two cores 302. Further in this particular implementation, inter-core interconnect circuitry 306 interconnects the L2 caches with a shared level 3 (L3) cache 308. The shared L3 cache 308 is shown divided into banks.

As further shown in FIG. 3, one or more memory controllers 310 on the chip multiprocessor die 102 may be configured to communicate by way of the relatively thicker conductive connections 112 which interconnect those contact pads 120 with input/output connections (see 108) of the package 106. The one or more memory controllers 310 also connect to stacked cache interface circuitry 312 which is on the CMP die 102. While one block of circuitry is depicted in FIG. 3 for the stacked cache interface circuitry 312, the stacked cache interface circuitry 312 may comprise one block or multiple blocks of circuitry. The stacked cache interface circuitry 312 may be configured to communicate by way of the relatively thinner conductive connections 114 which interconnect those contact pads 130 with the optional stacked cache die 110.

The stacked cache interface circuitry 312 may be small and so may be implemented without adding much cost to the CMP die 102 in the case where the CMP die 102 is not stacked (i.e. where no stacked cache die 110 are used and there are no stack die connections 114). Also, power to the stacked cache interface circuitry 312 may be configured so as to be unconnected in the case where the CMP die 102 is not stacked.

The memory controllers 310 may be configured to signal the stacked cache interface circuitry 312 so as to find out if one or more stacked cache die are present or if there are no stacked cache die. The stacked cache interface circuitry 312 may be configured to detect the presence of the optional stacked cache (e.g., a level 4 cache) die 110 by several mechanisms. One such mechanism comprises receiving a reply (acknowledgement signal) to signals transmitted to the stacked cache die 110 to indicate presence of the stacked cache die 110 or not receiving a reply to such signals which would indicate an absence of the stacked cache die 110. Another mechanism comprises an absence of a signal path due to a lack of stacking (i.e. the signal path is open circuit when there is no stacked cache die 110).

Figure 4:
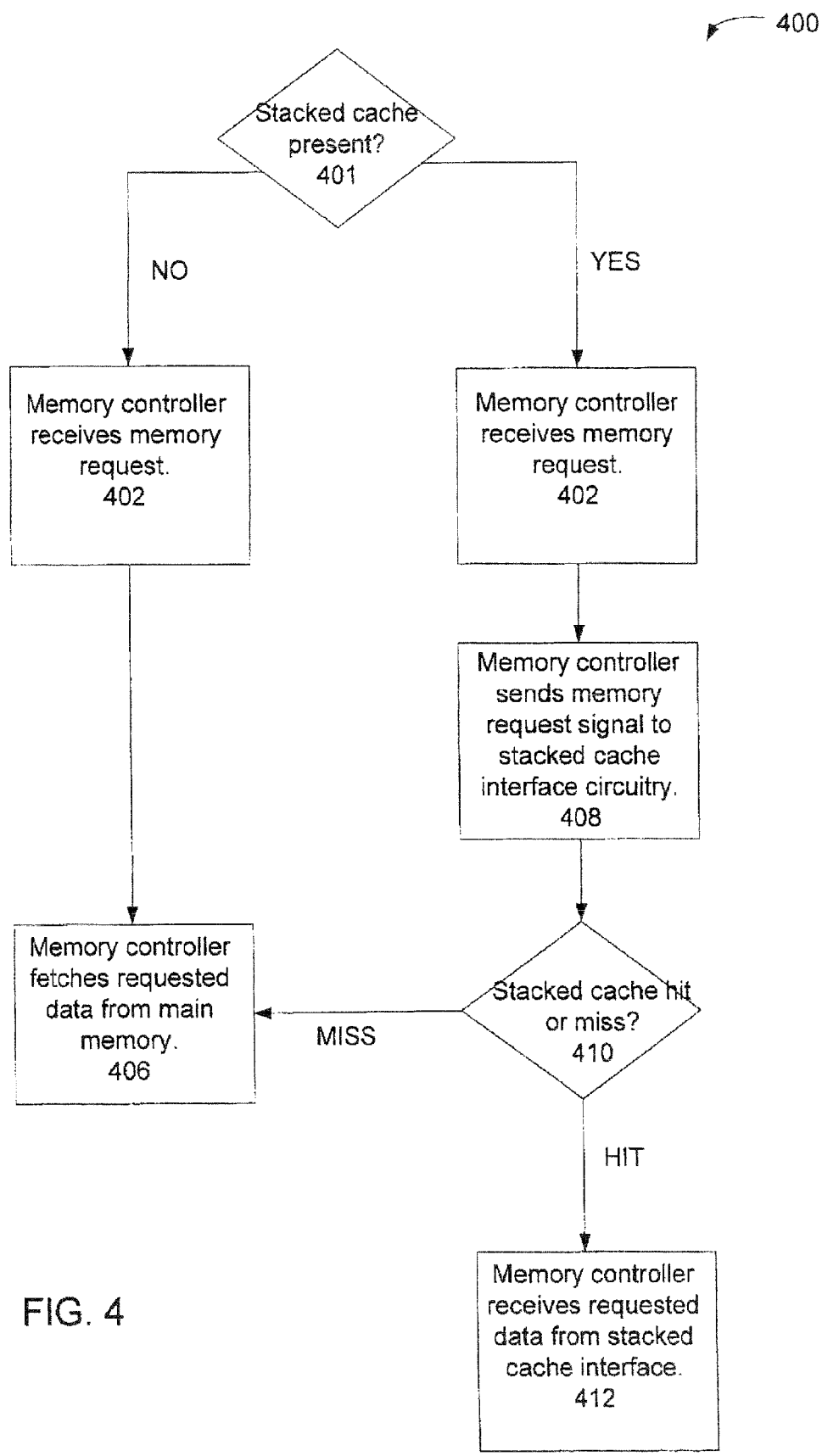
FIG. 4 is a flow chart of a method performed by a memory controller of a modular 3-D chip multiprocessor in accordance with an embodiment of the invention.

FIG. 4 shows a logical method 400 performed by a memory controller 310 of a chip multiprocessor 102 in accordance with an embodiment of the invention. As shown by the branch point 401, processing of a memory request is different depending on whether or not at least one stacked cache die is present. In accordance with an embodiment of the invention, the determination 401 as to whether one or more stacked cache die is present or absent may be performed at power-up by the memory controllers 310. For example, in accordance with one embodiment of the invention, power to the stacked cache interface circuitry 312 may be disconnected during manufacture of the die 102 if there are no stacked cache die to be included in the system. In that case, the presence or absence of power to the stacked cache interface circuitry 312 may be used by the memory controllers 310 as an indication of the presence or absence of stacked cache die.

The memory controller 310 receives 402 a memory request. If no stacked cache die is present, then the memory controller 310 fetches 406 the requested data from the main memory (for example, from the memory DIMMs). In other words, in the lower-performance lower-cost configuration shown in FIG. 2A, the memory controller 310 on the chip multiprocessor 102 accesses main memory for the missing data.

On the other hand, if there is a stacked cache (i.e. if there is one or more cache die) 110, then the memory controller 310 attempts to find the data in the stacked cache 110 by sending 408 a memory request signal to the stacked cache interface circuitry 312. If 410 the data is found in the stacked cache (i.e. a stacked cache hit), then the memory controller 310 receives 412 the requested data from the stacked cache interface 312. If the data cannot be found in the stacked cache (i.e., a stacked cache miss), then the memory controller 310 resorts to fetching 406 the data from memory.

In accordance with one embodiment, the chip multiprocessor die 102 includes one or more near cache levels, and the stacked cache die(s) 110 include optional cache levels which are higher (farther) than those levels on the chip multiprocessor die 102. In that case, memory requests would be processed by first checking the near cache levels on the CMP die 102. Upon near cache misses such that the data requested is not found on the CMP die 102, the memory controller 310 would then send a memory request signal to the stacked cache interface circuitry 312. If the data is found in the stacked cache (i.e.

a stacked cache hit), then the memory controller 310 receives 412 the requested data from the stacked cache interface 312. If 410 the data cannot be found in the stacked cache (i.e., a stacked cache miss), then the memory controller 310 resorts to fetching 406 the data from memory.

The architecture disclosed in the present application has several advantages or potential advantages. First, processor manufacturers are generally interested in providing a range of products to cover different markets. However, designing different products for different markets is typically rather expensive. Instead, with optional stacking, manufacturers may sell a stacked chip microprocessor in markets that had higher performance demands and required a more powerful memory system (e.g., enterprise servers and high-performance computing applications), while the base die may be used in lower-performance cost-sensitive applications (e.g., home consumer and laptop applications). The lower-performance lower-cost version of the product may be built simply by omitting some or all of the stacked die.

Second, by placing all the cores on a single die, this architecture produces a low thermal resistance between the cores and the heat sink. Since the cores dissipate the vast majority of the power, this yields the lowest operating temperature (i.e. most efficient heat sinking) for the stack as a whole.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of processing a memory request by a memory controller of a chip multiprocessor configured to be stackable with optional cache die, the method comprising:
   determining whether any stacked cache die is present;
   receiving the memory request for data;
   sending a memory request signal to stacked cache interface circuitry if at least one stacked cache die is present, wherein the at least one stacked cache die is separate from a multiprocessor die of the chip multiprocessor, and wherein the multiprocessor die is to be provided in a stacked arrangement of dies at a stacking level different from a stacking level of the stacked cache die; and
   fetching the requested data from main memory if no stacked cache die is present.

2. The method of claim 1, further comprising, after sending the memory request signal to the stacked cache interface circuitry, receiving the requested data upon a cache hit in the at least one stacked cache die, and fetching the requested data from the main memory upon a cache miss in the at least one stacked cache die.

3. The method of claim 1, wherein determining whether any stacked cache die is present is done during power-up of the chip multiprocessor.

4. The method of claim 1, wherein presence of the at least one stacked cache die is determined by presence of a signal path.

5. The method of claim 1, wherein presence of the at least one stacked cache die is determined by receipt of an acknowledgement signal from the at least one stacked cache die.

6. The method of claim 1, wherein the chip multiprocessor further includes a first cache memory, and wherein the at least one stacked cache die includes a second cache memory at a cache level different from a cache level of the first cache memory.

\* \* \* \* \*